United States Patent
Javorka et al.

(10) Patent No.: US 8,513,074 B2
(45) Date of Patent: Aug. 20, 2013

(54) REDUCED THRESHOLD VOLTAGE-WIDTH DEPENDENCY AND REDUCED SURFACE TOPOGRAPHY IN TRANSISTORS COMPRISING HIGH-K METAL GATE ELECTRODE STRUCTURES BY A LATE CARBON INCORPORATION

(75) Inventors: Peter Javorka, Radeburg (DE); Stephan Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 113 days.

(21) Appl. No.: 13/101,764

(22) Filed: May 5, 2011

(65) Prior Publication Data

US 2012/0282744 A1 Nov. 8, 2012

(51) Int. Cl.
*H01L 21/8238* (2006.01)
(52) U.S. Cl.
USPC .................................. 438/199; 257/E21.633

(58) Field of Classification Search
USPC .................................. 438/199; 257/E21.633
See application file for complete search history.

(56) References Cited

U.S. PATENT DOCUMENTS

| 6,849,527 B1 * | 2/2005 | Xiang | 438/528 |
| 2008/0121992 A1 * | 5/2008 | Yi et al. | 257/336 |

* cited by examiner

*Primary Examiner* — Daniel Whalen
(74) *Attorney, Agent, or Firm* — Williams, Morgan & Amerson, P.C.

(57) ABSTRACT

Performance and/or uniformity of sophisticated transistors may be enhanced by incorporating a carbon species in the active regions of the transistors prior to forming complex high-k metal gate electrode structures. On the other hand, increased yield losses observed in conventional strategies may be reduced by taking into consideration the increased etch rate of the carbon-doped silicon material in the active regions. To this end, the carbon species may be incorporated after the application of at least some aggressive wet chemical processes.

19 Claims, 12 Drawing Sheets

REDUCED THRESHOLD VOLTAGE-WIDTH DEPENDENCY AND REDUCED SURFACE TOPOGRAPHY IN TRANSISTORS COMPRISING HIGH-K METAL GATE ELECTRODE STRUCTURES BY A LATE CARBON INCORPORATION

BACKGROUND OF THE INVENTION

1. Field of the Invention

Generally, the present disclosure relates to integrated circuits and, more particularly, to transistors comprising a high-k metal gate electrode structure formed in an early manufacturing stage.

2. Description of the Related Art

The fabrication of complex integrated circuits requires the provision of a large number of transistors, which represent the dominant circuit elements in complex integrated circuits. For example, several hundred million transistors may be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, the complementary transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface positioned between highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

When reducing the channel length of field effect transistors, generally an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may become increasingly incompatible with thermal power requirements of sophisticated integrated circuits, in some approaches, the inferior controllability of the channel region of the short channel transistors caused by the continuous reduction of the critical dimensions of gate electrode structures has been addressed by an appropriate adaptation of the material composition of the gate dielectric material.

To this end, it has been proposed that, for a physically appropriate thickness of a gate dielectric material, i.e., for a thickness resulting in an acceptable level of gate leakage currents, a desired high capacitive coupling may be achieved by using appropriate material systems, which have a significantly higher dielectric constant compared to the conventionally used silicon dioxide-based materials. For example, dielectric materials including hafnium, zirconium, aluminum and the like may have a significantly higher dielectric constant and are therefore referred to as high-k dielectric materials, which are to be understood as materials having a dielectric constant of 10.0 or higher when measured in accordance with typical measurement techniques. As is well known, the electronic characteristics of the transistors also strongly depends on the work function of the gate electrode material, which in turn influences the band structure of the semiconductor material in the channel regions separated from the gate electrode material by the gate dielectric layer. In well-established polysilicon/silicon dioxide-based gate electrode structures, the corresponding threshold voltage that is strongly influenced by the gate dielectric material and the adjacent electrode material is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors and the like. For this reason, corresponding metal-containing conductive materials may be positioned close to the high-k gate dielectric material in order to form an appropriately designed interface that results in the target work function of the gate electrode structure. In some conventional approaches, the work function adjustment is performed at a very late manufacturing stage, i.e., after any high temperature processes, after which a placeholder material of the gate electrode structures, such as polysilicon, is replaced by an appropriate work function adjusting species in combination with an electrode metal, such as aluminum and the like. In this case, however, very complex patterning and deposition process sequences are required in the context of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the metal species may be thermally stabilized and encapsulated in order to obtain the desired work function and thus threshold voltage of the transistors without being unduly influenced by the further processing. It turns out that, for many appropriate metal species and metal-containing electrode materials, an appropriate adaptation of the band gap of the channel semiconductor material may be required, for instance, in some P-channel transistors, in order to appropriately set the work function thereof. For this reason, frequently, a so-called threshold adjusting semiconductor material, for instance in the form of a silicon/germanium mixture, is formed on the active regions of these P-channel transistors prior to forming the gate electrode structures, thereby obtaining the desired offset in the band gap of the channel semiconductor material.

With reference to FIGS. 1a-1c, a conventional process technique will now be described in more detail, in which a threshold voltage adjusting semiconductor material may be selectively formed in some transistors, while other transistors are appropriately masked.

FIG. 1a schematically illustrates a cross-sectional view of a semiconductor device 100 in a very advanced manufacturing stage. As shown, the semiconductor device 100 comprises a substrate 101, such as a silicon substrate and the like, on which is formed a semiconductor layer 102, such as a silicon layer, which in turn is laterally divided into a plurality of active regions 102A, 102B. To this end, appropriate isolation structures, such as a shallow trench isolation region 102C, are provided so as to separate and laterally delineate the active regions 102A, 102B. In the manufacturing stage shown, a first transistor 150A is formed in and above the active region 102A and comprises a sophisticated high-k metal gate electrode structure 160A. As discussed above, the gate electrode structure 160A is formed on a silicon/germanium material 103A that has an appropriate thickness and material composition, i.e., germanium concentration, so as to obtain a desired band gap offset with respect to the silicon base material of the active regions 102A, 102B. Consequently, the silicon/germanium material 103A represents a part of the active region 102A and results in an appropriate work function and thus threshold voltage for the transistor 150A, which is a P-channel transistor that requires a dedicated threshold voltage. To this end, the gate electrode structure 160A typically comprises a gate dielectric layer 161A, which is provided in the form of a high-k dielectric material having a dielectric constant of 10.0 or higher. It should be appreciated that the gate dielectric material 161A may comprise a conventional dielectric material, such as a silicon oxynitride material and the like, in combination with a specific high-k material, such as hafnium oxide and the like. Furthermore, the gate electrode structure 160A comprises a metal-containing electrode material 162A, for instance in the form of titanium nitride, which may include additional work function metals, such as aluminum and the like. In other cases, an appropriate work function metal may be incorporated in a portion of the gate dielectric material 161A, depending on the overall process strategy used for forming the gate electrode structure 160A.

Consequently, the threshold voltage adjusting material 103A in combination with the materials 161A, 162A substantially determined the threshold characteristics of the P-channel transistor 150A for otherwise given transistor characteristics.

Additionally, the gate electrode structure 160A comprises a further electrode material 163, such as a polysilicon material, and a protective liner or spacer 164, which is provided so as to confine any sidewall areas of sensitive materials, such as the gate dielectric material 161A and the electrode material 162A. Furthermore, a sidewall spacer structure 165 is typically provided so as to have an appropriate configuration that enables the formation of drain and source regions 152 having an appropriate lateral and vertical dopant profile. Consequently, on the basis of the appropriately designed drain and source regions 152 and the material 103A, in combination with the gate electrode structure 160A, a channel region 151 is defined in the active region 102A so as to provide the required electronic characteristics in order to obtain a desired threshold voltage for the transistor 150A.

Similarly, a second transistor 150B, such as an N-channel transistor, is formed in and above the active region 102B and comprises a gate electrode structure 160B that typically has a similar configuration as the gate electrode structure 160A. In order to comply with the threshold voltage requirements of the N-channel transistor 150B, the corresponding gate dielectric material 161B, which is also a high-k dielectric material, and/or a metal-containing electrode material 162B comprise an appropriate work function metal, such as lanthanum and the like, so as to obtain a desired work function and thus threshold voltage in combination with the specific dopant profiles of the drain and source regions 152.

The semiconductor device 100 as shown in FIG. 1A may be formed on the basis of the following processes. In an early manufacturing stage, the isolation region 102C is formed by applying well-established lithography, etch, deposition, anneal and planarization techniques so as to form trenches in the semiconductor layer 102 and filling the trenches with an appropriate dielectric material. By providing the isolation regions 102C, the lateral size and shape of the active regions 102A, 102B are defined. Next, the active region 102B is masked, for instance, by forming an appropriate dielectric material, such as an oxide material and the like, selectively above the active region 102B, which may be accomplished on the basis of well-established oxidation and/or deposition techniques in combination with appropriate lithography strategies, so as to remove any dielectric material from the active region 102A. Thereafter, the resulting surface of the active region 102A is conditioned, i.e., prepared, for the subsequent selective deposition of the silicon/germanium material 103A. To this end, well-established wet chemical processes are applied so as to remove native oxide and any other contaminants prior to performing a selective epitaxial growth process. If required, the active region 102A may be recessed prior to actually depositing the material 103A. In this manner, a superior overall surface topography may be accomplished. Thereafter, the dielectric mask material formed above the active region 102B is removed and the further processing is continued by depositing appropriate materials for the dielectric gate layers 161A, 161B and the metal-containing electrode materials 162A, 162B. It should be appreciated that, depending on the specific process strategy, providing an appropriate work function metal may involve the deposition of respective metal layers, which are then appropriately patterned and subjected to a heat treatment in order to diffuse the corresponding work function metal into the lower lying gate dielectric material 161A, 161B, respectively. In other cases, specific work function metal layers are deposited in the form of the layers 162A, 162B followed by the deposition of the material 163 and any further sacrificial materials, such as hard mask materials and the like as required for patterning the resulting layer stack. Next, a highly complex patterning sequence is applied so as to pattern the layer stack on the basis of the corresponding design rules, which may require a gate length of 50 nm and significantly less in sophisticated applications. In this patterning sequence, complex lithography processes have to be applied in combination with complex etch techniques, wherein the presence of any surface irregularities, material non-uniformities and the like may significantly affect the final patterning results.

By providing the materials 161A, 162A, 161B, 162B in combination with the material 103A, the transistor characteristics are basically determined in an early manufacturing stage, in combination with the complex dopant profile for the drain and source regions 152, still to be formed, so that any undue variation of the electronic characteristics of the gate electrode structures 160A, 160B during the further processing are to be avoided. In particular, the sensitive materials 161A, 162A and 161B, 162B have to be reliably confined, which is accomplished by providing the liner 164, for instance in the form of a highly conformal and stable silicon nitride material.

Thereafter, the further processing is continued by forming the drain and source regions 152 in combination with the spacer structure 165, which is accomplished by applying well-established process techniques. Finally, sophisticated anneal processes, such as laser-based anneal techniques and the like, are frequently applied, in particular when highly scaled transistors are considered.

Upon applying the above-described process sequence, however, it turns out that a significant variation of transistor characteristics, in particular a variation of the threshold voltage, in particular of N-channel transistors, may be observed, as will be explained in more detail with reference to FIGS. 1b and 1c.

FIG. 1b schematically illustrates a top view of the device 100, wherein the transistor 150B is illustrated only, since the threshold valuations are particularly pronounced in N-channel transistors, as discussed above. In FIG. 1B, the transistor 150B has a specific width, as indicated by 102W, which substantially determines the current drive capability of the transistor 150B. Without intending to restrict the present application to any specific theory, it is assumed that, in particular during any new processes performed at a final stage so as to re-crystallize implantation-induced damage and activate drain and source dopant species, a significant modification may occur locally in the sensitive materials of the gate electrode structure 160B. For example, during a laser anneal process, the temperature of a corresponding portion of the device 100 may be locally increased within a thickness of several micrometers, thereby facilitating the migration of dopant species to a next lattice site. During the time interval of elevated temperature acting on the transistor 150B, and in particular on the gate electrode structure 160B, it is assumed that a modification may take place in the sensitive materials 161B, 162B (FIG. 1a). For example, it is assumed that high-k dielectric materials may have an increased affinity to oxygen, while also a certain degree of oxygen migration may occur during high temperature processes, which may result in a certain amount of oxygen vacancies, according to some non-confirmed theories. During the anneal process, therefore, oxygen may be incorporated into the gate electrode structure 160B, preferably from the edges 102E of the active region 102B, for instance due to the presence of the isolation region 102C, at areas in which the gate electrode structure 160B is in contact with the isolation region 102C. Consequently, it is believed that an increased oxygen ingress into the gate electrode structure 160B may be induced due to laser-based anneal processes. Although the reason is still unknown, a corresponding modification may occur in N-channel transistors to a significantly higher degree compared to P-channel transistors. Thus, the characteristics of the gate electrode structure 160B may be locally modified in the transistor 150B and may thus result, for instance, in a significant shift of the threshold voltage locally at corresponding edges of the active region 102B, which may thus also result in a shift of threshold voltage for the entire transistor 150B. Since the corresponding modification of the high-k dielectric material and/or of the corresponding conductive cap material may be locally restricted to the corresponding edge regions, the overall influence on the transistor 150B may be higher for a reduced transistor width.

FIG. 1c schematically illustrates a top view of the device 100 when the transistor 150B represents a transistor of reduced width. Since here the sphere of influence on the gate electrode structure 160B may be comparable to the situation as shown in FIG. 1B, in total the influence on the overall threshold voltage of the transistor 150B having the reduced transistor width is significantly more pronounced compared to the device as shown in FIG. 1b, so that generally the transistors 150B of different width may have a different threshold voltage.

As a consequence, since typically a plurality of different transistor widths may have to be implemented in complex semiconductor devices, a pronounced variation of the threshold voltages with transistor width may be observed, in particular for N-channel transistors.

It has been realized that the incorporation of carbon at and near the surface of the active regions, in particular in N-channel transistors, significantly improves the situation and resides in superior stability of the threshold voltage of N-channel transistors of different transistor width.

FIG. 1d schematically illustrates a cross-sectional view of the semiconductor device 100, in which the transistors 150A, 150B have basically the same configuration as discussed earlier, wherein, however, a carbon species 104 is incorporated into the active regions 102A, 102B. Typically, the carbon species 104 is incorporated on the basis of an ion implantation process, which is performed in an early manufacturing stage, as will be described with reference to FIGS. 1e and 1f.

FIG. 1e schematically illustrates the semiconductor device 100 during an ion implantation process 110 in order to introduce the carbon species 104 into the active regions 102A, 102B. In the process strategy shown in FIG. 1e, a deposition mask 105, such as a silicon dioxide material, for instance formed by oxidation, as indicated by the dashed line, a silicon nitride material, and the like may be provided so as to reliably cover the active region 102B, while exposing the active region 102A in order to subsequently form the threshold voltage adjusting semiconductor material. During the implantation process 110, which is typically performed on the basis of an implantation energy of several keV with an implantation dose of approximately $1 \times 10^{14}$ to $4 \times 10^{14}$ cm$^{-2}$, the carbon species 104 is incorporated through the mask 105 so as to extend to an appropriate depth. It has been recognized that the presence of the carbon species 104 in the active region 102A may also be highly advantageous with respect to reducing the overall crystalline defects upon forming the threshold voltage adjusting semiconductor material.

FIG. 1f schematically illustrates the semiconductor device 100 in a further advanced manufacturing stage. As shown, the material 103A is formed selectively in the active region 102A, while the active region 102B is still covered by the deposition mask 105. Thereafter, the further processing may be continued on the basis of process techniques as is also described above. For example, depending on the overall process strategy, prior to or after providing the threshold voltage adjusting semiconductor material 103A, appropriate dopant species are introduced into the active regions 102A, 102B by applying appropriate masking regimes and implantation techniques.

Although the above-described process sequence is highly efficient in incorporating a carbon species, which in turn may significantly improve transistor performance and reduce threshold voltage variations, in particular in N-channel transistors, it has been observed that pronounced yield losses may occur, which are mainly associated with gate failures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which gate electrode structures including a high-k dielectric material may be formed in an early manufacturing stage, while at the same time reducing the variability of transistor characteristics, such as the threshold voltage, in particular of N-channel transistors, by introducing a carbon species prior to forming the sophisticated high-k metal gate electrode structures. At the same time, pronounced yield losses may be avoided by appropriately configuring the process flow such that an influence of wet chemical processes on the carbon doped semiconductor material of the active regions may be reduced.

Without intending to restrict the present application to the following explanation, it is, however, strongly believed that the significant yield losses are associated with an inferior surface topography caused by the processing prior to actually patterning the complex high-k metal gate electrode structures. As discussed above, the process of patterning the sophisticated high-k metal gate electrode structures sensitively depends on the device topography of the active regions and the isolation regions prior to forming the gate layer stack. It has been recognized that the presence of the carbon species in the active regions may have a significant influence on the resulting surface topography, since the carbon species may influence the etch behavior of the silicon base material during any aggressive wet chemical processes, such as wet chemical cleaning processes, wet chemical etch processes and the like, which typically have to be applied in order to condition exposed surface areas, remove contaminants and the like. Consequently, the exposure of the carbon doped silicon material to wet chemical processes may, thus, result in non-predictable surface conditions, at least to a certain degree, which in turn may contribute to inferior process conditions upon patterning the complex high-k gate electrode structures. Consequently, in some illustrative aspects disclosed herein, the incorporation of the carbon species within the entire process flow is accomplished at a later stage compared to the conventional strategy, thereby reducing the degree of exposure of the carbon doped silicon material to any wet chemical processes.

One illustrative method disclosed herein comprises forming a threshold voltage adjusting semiconductor material on a semiconductor material of the first active region of a first transistor, while masking a second active region of a second transistor. The method further comprises performing at least one wet chemical process and, after performing the at least one wet chemical process, a carbon species is provided near a surface of the first and second active regions. The method further comprises forming a dielectric material layer above the first and second active regions after providing the carbon species. Moreover, the method comprises forming a first gate electrode structure on the threshold voltage adjusting semiconductor material of the first active region and forming a second gate electrode structure on the second active region by using the dielectric material so as to provide a gate dielectric material.

A further illustrative method disclosed herein relates to forming a semiconductor device. The method comprises performing one or more wet chemical processes on a surface of an active region. Thereafter, carbon is incorporated into the active region and a dielectric layer is formed on the active region that has incorporated therein the carbon, wherein application of a further wet chemical process prior to forming the dielectric layer is avoided. Additionally, the method comprises forming a gate electrode structure above the active region by using the dielectric layer.

A still further illustrative method disclosed herein comprises forming a threshold voltage adjusting semiconductor material on the first active region, while masking a second active region with a dielectric deposition mask. The method further comprises conditioning a surface of the first and second active regions by performing at least one wet chemical process. Moreover, the method comprises incorporating carbon into the first and second active regions after performing the at least one wet chemical process. The method further comprises forming a first gate electrode structure on a conditioned surface of the first active region and a second gate electrode structure on a conditioned surface of the second active region, wherein the first and second gate electrode structures comprise a high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
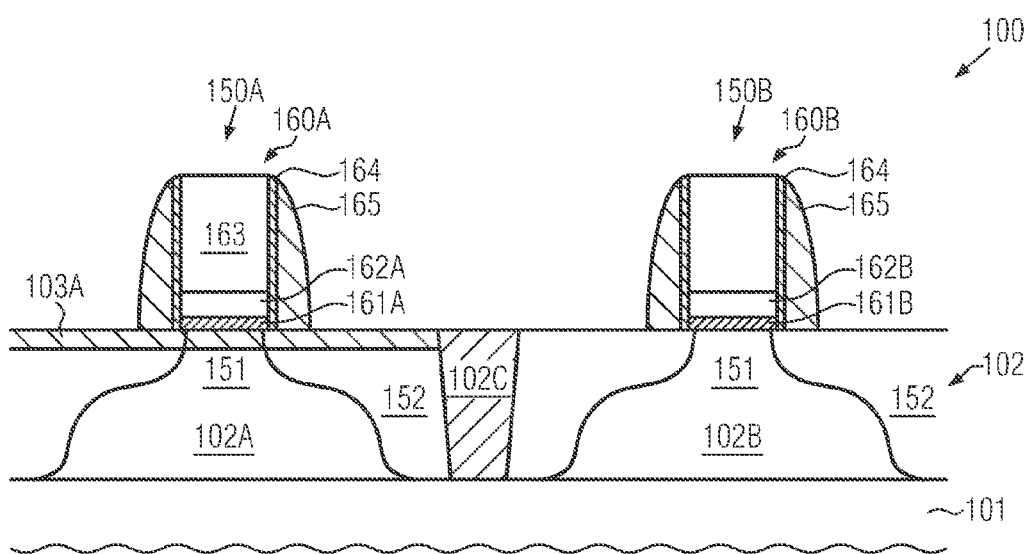
FIGS. 1a-1c schematically illustrate a cross-sectional view and top views, respectively, of a sophisticated semiconductor device in which the threshold voltage of high-k metal gate electrode structures may be adjusted in an early manufacturing stage, for instance, by using a silicon/germanium material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which a carbon species may be incorporated into the active regions of transistors, in particular of N-channel transistors, while at the same time undue increase of yield losses may be avoided or at least reduced. To this end, it has been recognized that carbon-doped silicon material of the active regions of the transistors may have a different etch rate, depending on the previous process history, thereby resulting in highly non-predictable process conditions during the further processing, in particular during the exposure to aggressive wet chemical processes, as are, however, actually required for conditioning exposed surface areas and the like. Consequently, upon exposing the carbon-doped material of the active regions two wet chemical processes, the resulting surface topography, for instance, the divots or generally the recessing of the active regions and their step height with respect to the isolation regions may be increased, thereby contributing to corresponding device failures, such as insufficient encapsulation of sensitive gate materials and the like.

Figure 1B:
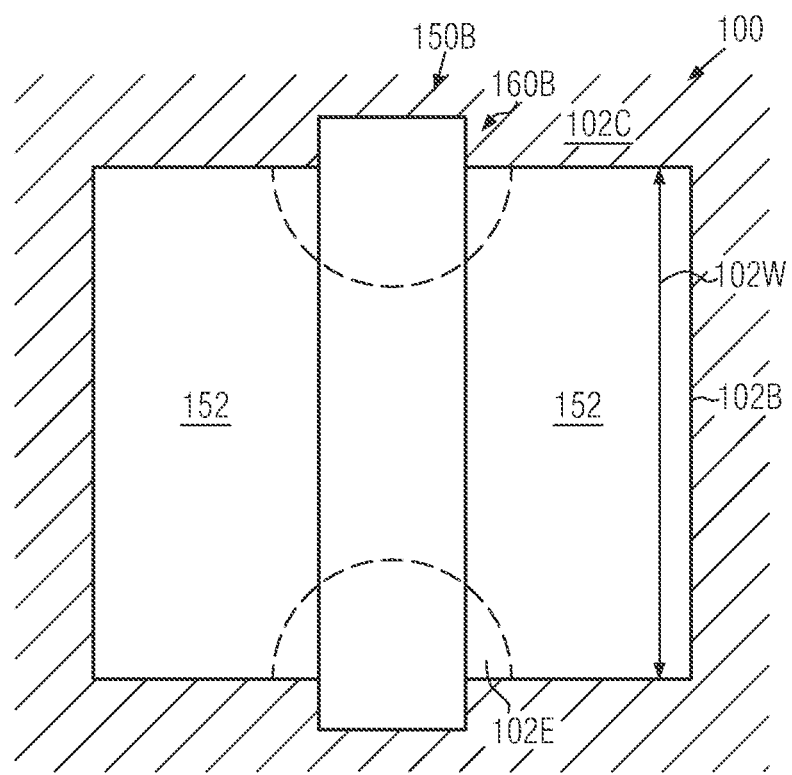
Figure 1C:
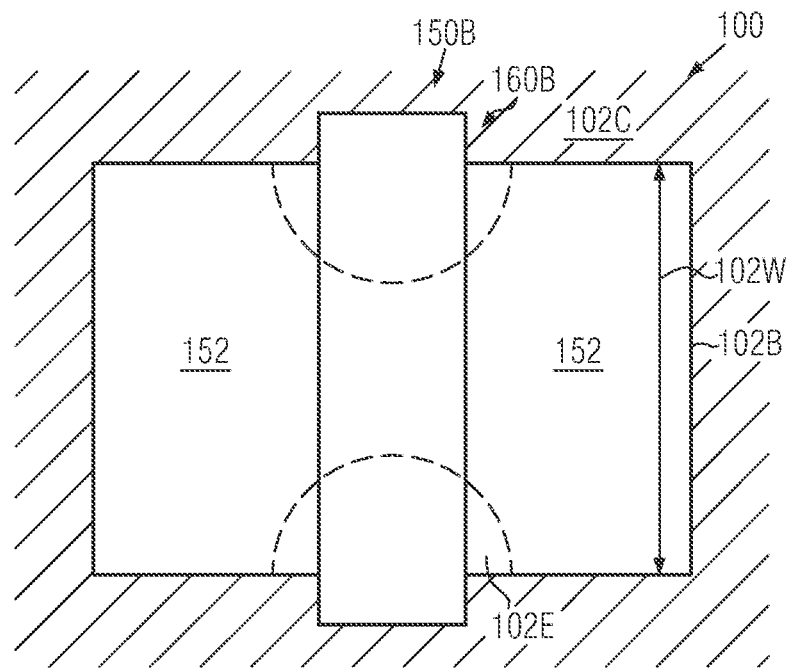
Figure 1D:
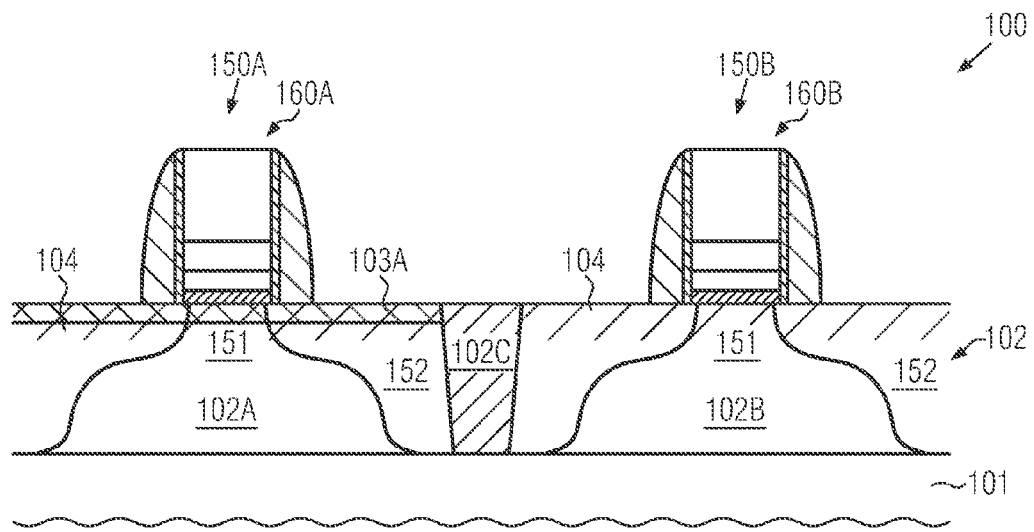
FIG. 1d schematically illustrates a cross-sectional view of the semiconductor device, wherein a carbon species is incorporated so as to reduce a pronounced dependency of the resulting threshold voltage from the transistor width, according to conventional strategies.
Figure 1E:
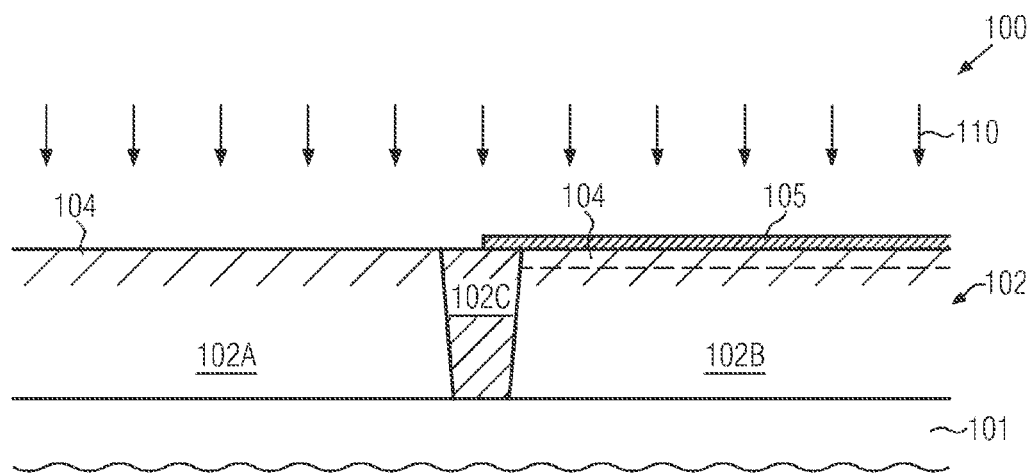
FIGS. 1e and 1f schematically illustrate cross-sectional views of the semiconductor device upon incorporating a carbon species prior to forming the threshold voltage adjusting semiconductor material, according to conventional strategies.
Figure 1F:
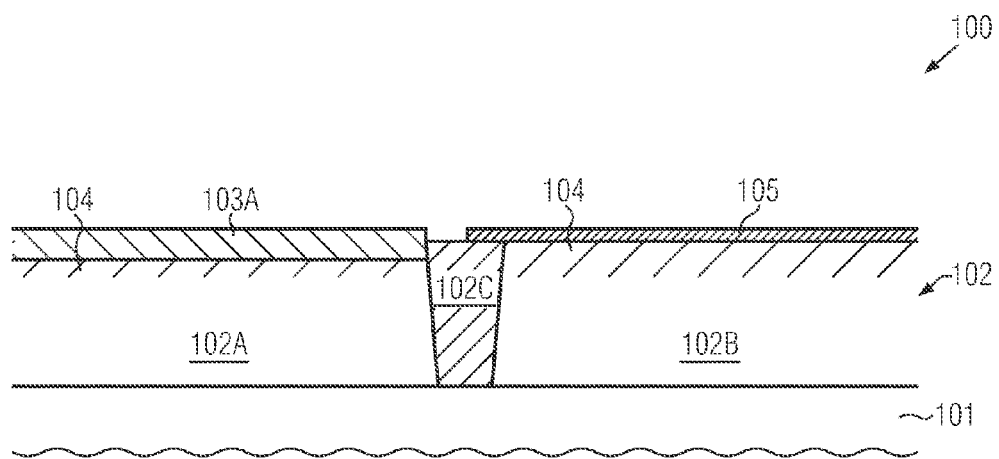
Figure 1G:
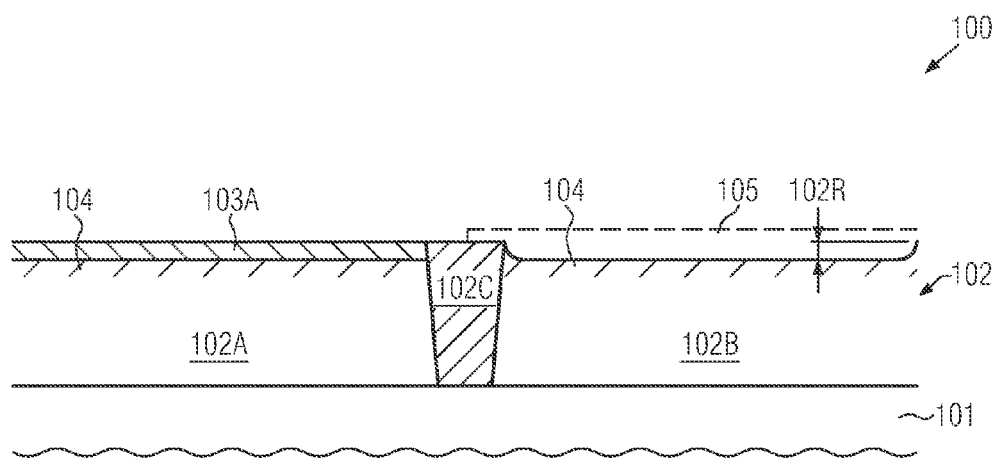
FIGS. 1g and 1h schematically illustrate cross-sectional views of the semiconductor device during advanced manufacturing stages, when the patterning of the sophisticated high-k metal gate electrode structures is performed in the presence of the carbon species, thereby inducing a pronounced surface topography that has been recognized according to the principles disclosed herein as a major source of the pronounced yield losses in the conventional strategies.
Figure 1H:
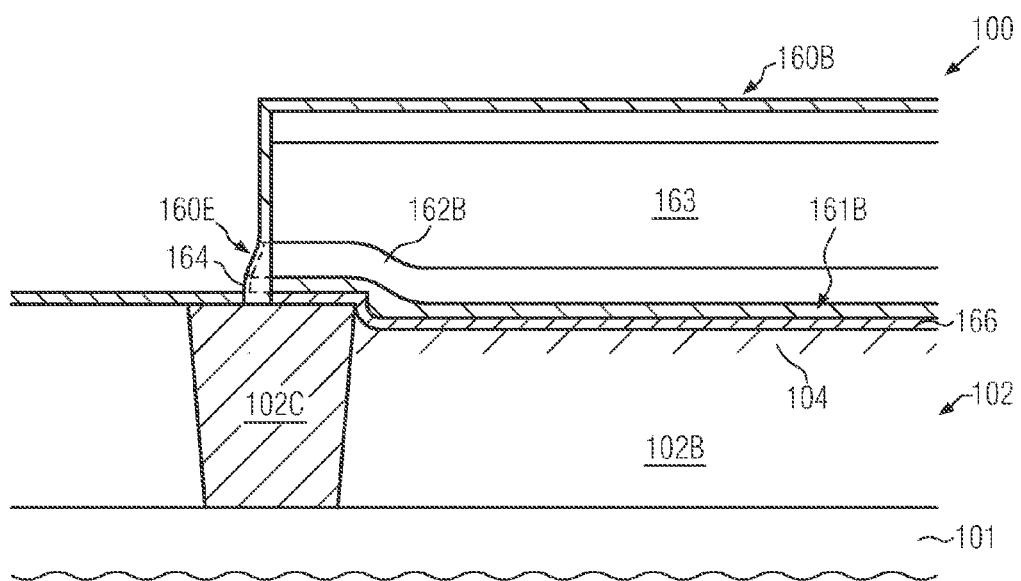

With reference to FIGS. 1h and 1h, the critical phase of the conventional manufacturing process will now be described, which is believed to significantly cause device irregularities upon patterning the sophisticated high-k metal gate electrode structures.

FIG. 1g schematically illustrates the semiconductor device 100 in a manufacturing stage in which the carbon species 104 has already been incorporated into the active regions 102A, 102B, followed by the deposition of the threshold adjusting semiconductor material 103A, as is previously described. In this stage, the deposition mask 105 is to be removed, which is typically associated with performing at least one wet chemical etch process, for instance, based on hydrofluoric acid (HF) or any other appropriate wet chemistry, which may also affect the underlying silicon base material of the active region 102B. Due to the presence of the species 104 in the exposed surface of the active region 102B, the etch rate may be significantly increased, thereby contributing to a certain degree of recessing, as indicated by 102R. Furthermore, during the further processing, the exposed surface areas of the active regions 102A, 102B have to be prepared or conditioned for the subsequent deposition of, for instance, an appropriate dielectric material, such as a silicon oxide material and the like, wherein any further wet chemical conditioning process may also result in a more pronounced etch rate in the active region 102B due to the presence of the species 104. Furthermore, depending on the overall process strategy, any well dopant species may be incorporated into the active regions 102A, 102B in this manufacturing stage, thereby requiring an appropriate masking regime, which in turn may also be accompanied by corresponding resist removal processes and corresponding cleaning recipes. As a consequence, prior to actually providing materials for the gate electrode structures, in particular, the active region 102B having the carbon species 104 formed at and in the vicinity of the surface may have experienced a significant material loss, which may contribute to a more pronounced surface topography prior to patterning the complex gate layer stack.

FIG. 1h schematically illustrates the device 100 in cross-sectional view in a further advanced manufacturing stage, in which the gate electrode structure 160B is already patterned. It should be appreciated that the cross-section is taken along the transistor width direction 102W (FIG. 1B). Thus, due to the pronounced surface topography, certain patterning related non-uniformities, such as undercut (not shown) or protruding portions, as indicated by 160E, may be created during the complex patterning sequence, which in turn may contribute to further non-uniformities, for instance when forming the liner 164, thereby increasing the probability of reducing gate integrity during the further processing, for instance with respect to the sensitive materials 161B, 162B, which may be formed on a conventional dielectric material 166 according to some illustrative strategies. Thus, the reduced reliability of the confinement of the sensitive materials 161B, 162B may result in undue exposure of these materials, which in turn may contribute to material loss, shift of material characteristics and the like.

According to the principles disclosed herein, it has been recognized that the inferior surface topography caused by the processing prior to actually patterning the sophisticated gate electrode structures may be correlated with the etch characteristics of the carbon-doped semiconductor base material of the active regions.

Figure 2A:
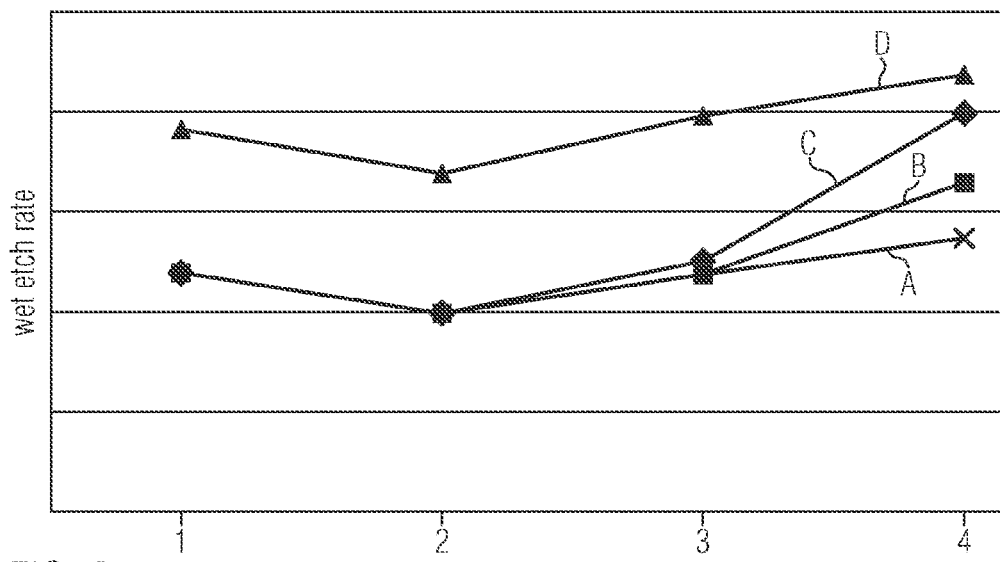
FIGS. 2a and 2b schematically illustrate plots which indicate the dependency of the etch rate of the silicon base material in the active region during the wet chemical processes with and without an incorporated carbon species.

FIG. 2a schematically illustrates a plot, in which a correlation between etch rate of silicon material and carbon-doped silicon material for various process histories are illustrated. The horizontal axis of FIG. 2a indicates four different process situations with respect to the thermal treatment of substrates, while curves A, B, C and D represent four different situations of the further processing of these substrates. That is, position 1 indicates sample substrates, which have been annealed at a temperature of 1050° C. for 50 minutes. Position 2 indicates substrates having experienced an anneal process at 1150° C. for 30 minutes, while position 3 relates to a treatment at 700° C. for 15 minutes in combination with an anneal process at 1050° C. for 20 minutes. Finally, position 4 indicates a rapid thermal anneal (RTA) process at a temperature of 1150° C. for five seconds. For these different pre-processings, curve A represents the etch rate after a further RTA process with five seconds, while curve B relates to a process time of 15 seconds. Moreover, curve C indicates the etch rate without any further anneal process. On the other hand, curve D represents the etch rate after a carbon implantation into the silicon base material for the four different situations, thereby clearly indicating that the resulting etch rate increases for any of these different treatments with carbon being present in the silicon base material.

Figure 2B:
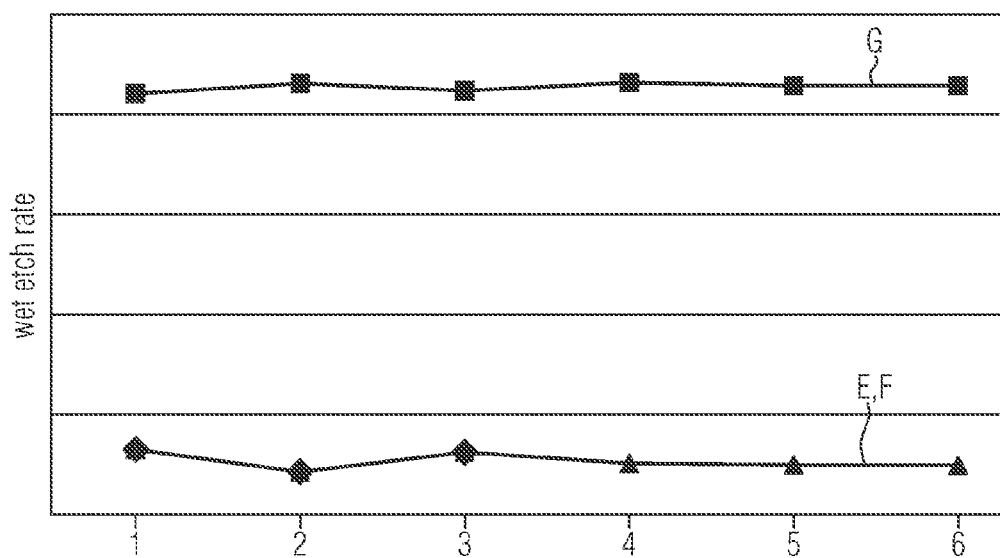

FIG. 2b schematically illustrates a plot, in which the etch rates of silicon and carbon-doped silicon materials are represented for six different process histories, indicated as positions 1 to 6 on the horizontal axis. In this example, any of the sample substrates has been treated twice on the basis of an anneal process at 1050° C. with a duration of 50 minutes. Curves E, F represent the etch rates after performing additional RTA processes with different temperatures and/or durations with and without applying diluted hydrofluoric acid (DHF) as indicated by the positions 1 to 6, while curve G illustrates the etch rate for the carbon-doped silicon material for these different additional treatments. As is evident from FIG. 2b, upon performing a pre-processing on the basis of performing two times the anneal process at a temperature of 1050° C. for 50 minutes, a substantially constant etch rate is obtained for the silicon material, irrespective of the actual process history. Similarly, the etch rate for the carbon-doped silicon material is highly constant, however, significantly increased compared to the pure silicon material.

As a consequence, in some illustrative embodiments disclosed herein, the increased etch rate of the carbon-doped silicon material during wet chemical processes, such as highly aggressive cleaning processes and the like, may be avoided or the effect thereof may be significantly reduced by incorporating the carbon species in a later manufacturing stage, for instance, in one illustrative embodiment, immediately prior to depositing a dielectric material that may be used for the patterning of the gate electrode structures. Hence, by incorporating the carbon species in a later manufacturing stage, any additional surface topography, which may be generated in the conventional process strategy, may be reduced, since the carbon-doped semiconductor material may be exposed to aggressive wet chemical processes to a significantly lesser degree, thereby providing superior process conditions upon patterning the complex gate electrode structures. For example, the carbon species may be incorporated after the deposition of the threshold voltage adjusting semiconductor material and after the removal of the corresponding deposition mask, thereby avoiding at least the exposure to the wet chemical etch recipe that is typically applied for removing the deposition mask. Thus, at least one of the required wet chemical processes may be performed prior to incorporating the carbon species, thereby reducing the negative effect of the increased etch rate of the carbon-doped semiconductor material when exposed to the wet chemical process.

In still other illustrative embodiments, additional wet chemical processes may be applied prior to incorporating the carbon species, for instance as associated with forming resist masks for implantation processes, such as a mask regime for incorporating appropriate well dopant species, thereby even further reducing any negative effect of wet chemical processes on the resulting surface topography prior to forming the gate layer stack.

In other illustrative embodiments, additionally, any appropriate processes may be performed prior to exposing the active regions to wet chemical processes, thereby achieving superior stability and thus a more uniform influence of any wet chemical processes on the resulting surface topography prior to actually incorporating the carbon species. For example, as illustrated above with respect to FIGS. 2a and 2b, a highly predictable etch rate may be obtained for the non-carbon-doped semiconductor material, thereby providing superior predictability of the resulting surface conditions during the process sequence for forming the threshold voltage adjusting semiconductor material prior to actually incorporating the carbon species. On the other hand, a generally increased removal rate may be avoided by appropriately positioning the incorporation of the carbon species of at least some of the required wet chemical processes.

With reference to FIGS. 3a-3k, further illustrative embodiments will now be described in more detail, in which an appropriate position of the incorporation of the carbon species prior to patterning the gate electrode structures is implemented, possibly in combination with appropriate anneal processes.

Figure 3A:
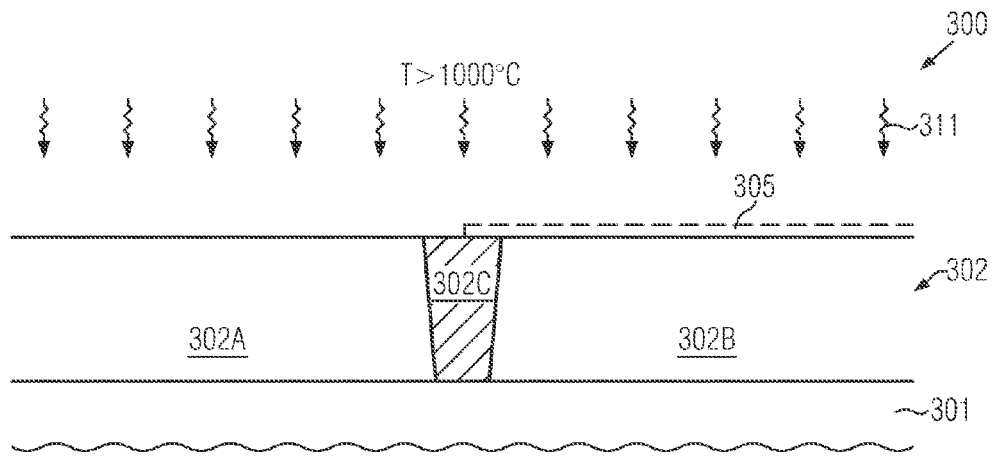
FIGS. 3a-3k schematically illustrate cross-sectional views of a semiconductor device during various manufacturing stages, in which a carbon species is incorporated at an appropriate point in the overall process sequence so as to reduce or avoid the negative influence of wet chemical processes on the carbon doped active regions, according to illustrative embodiments.

FIG. 3a schematically illustrates a cross-sectional view of a semiconductor device 300 in an early manufacturing stage. The device 300 may comprise a substrate 301 and a semiconductor layer 302, such as a silicon layer and the like, which may comprise a plurality of active regions that are laterally delineated by an isolation region 302C. It should be appreciated that a buried insulating layer (not shown) may be provided below the semiconductor layer 302, when a silicon-on-insulator (SOI) architecture is considered. With respect to the components described so far, the same criteria may apply as previously discussed with reference to the semiconductor device 100. In some illustrative embodiments, as shown, one or more anneal processes 311 may be applied in this manufacturing stage in order to provide superior stability with respect to etch rate variations during the further processing, as is, for instance, explained above with reference to FIGS. 2a and 2B. For example, in some illustrative embodiments, at least one new process may be used in the sequence 311 with a temperature of 1000° C. and higher for a time interval of 30 minutes or more. In some illustrative embodiments, the time interval may be 50 minutes and more, wherein the appropriate process conditions may be established in a furnace of any appropriate configuration. In some illustrative embodiments, the sequence 311 may comprise two or more anneal processes, wherein, in one particular embodiment, each of the two or more anneal processes may be performed at a temperature of 1000° C. and higher. For example, applying a corresponding anneal process twice prior to exposing the material of the active regions 302A, 302B to wet chemical processes may provide a substantially constant etch rate, irrespective of the specific process history.

In other illustrative embodiments, a dedicated anneal process, such as the sequence 311, may not be applied in this manufacturing stage. Moreover, as shown, a deposition mask 305, for instance in the form of a silicon dioxide material, a silicon nitride material, a combination thereof and the like, may be provided so as to cover the second active region 302B, while exposing the first active region 302A. It is to be appreciated that a carbon species may not be incorporated in this manufacturing phase, contrary to the conventional approaches, as previously described.

Figure 3B:
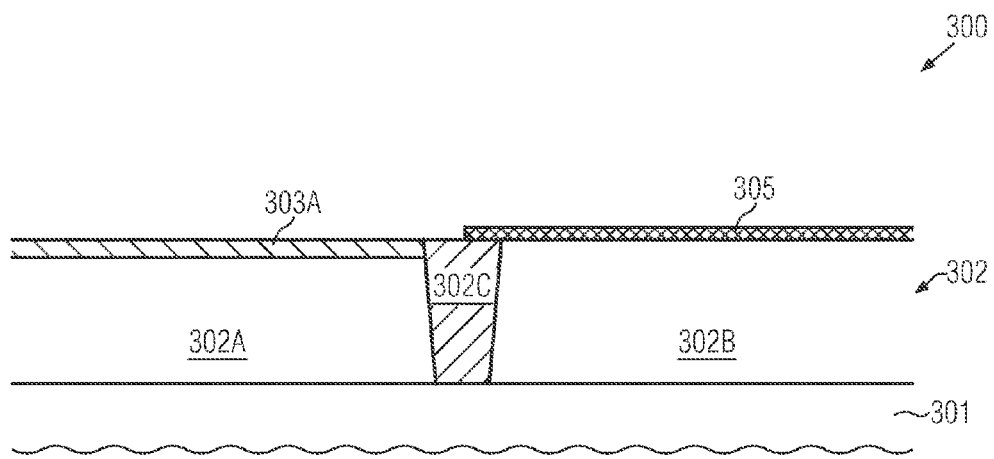

FIG. 3b schematically illustrates the semiconductor device 300 in a further advanced detection stage, in which the threshold voltage adjusting semiconductor material 303A, such as a silicon/germanium material, may be formed on the active region 302A and may thus represent a part thereof. On the other hand, the active region 302B may still be covered by the deposition mask 305.

The semiconductor device 300 as illustrated in FIG. 3b may be formed on the basis of similar process techniques as also discussed above. That is, after patterning an appropriate dielectric material so as to form the deposition mask 305, the device 300 may be exposed to any appropriate wet chemical process for conditioning or preparing the surface of the active region 302A for the subsequent selective epitaxial growth process. Since any carbon species may not yet be incorporated into the active regions 302A, 302B, a reduced and thus more predictable material loss may be encountered in the active region 302A. It should be appreciated that, if required, a certain degree of recessing may be intentionally implemented so as to refill or overfill the corresponding recess with the material 303A.

Thereafter, the processing may be continued by removing the mask 305 or by performing additional implantation processes, for instance for incorporating any well dopant species, while, in other strategies, any such species may have been incorporated in an earlier manufacturing stage, when an appropriate degree of doping of the material 303A may be accomplished upon performing the selective epitaxial growth process. Consequently, any additional wet chemical processes, which may, for instance, be associated with forming and removing resist masks and the like, may be performed without a direct contact with a carbon-doped semiconductor material.

Figure 3C:
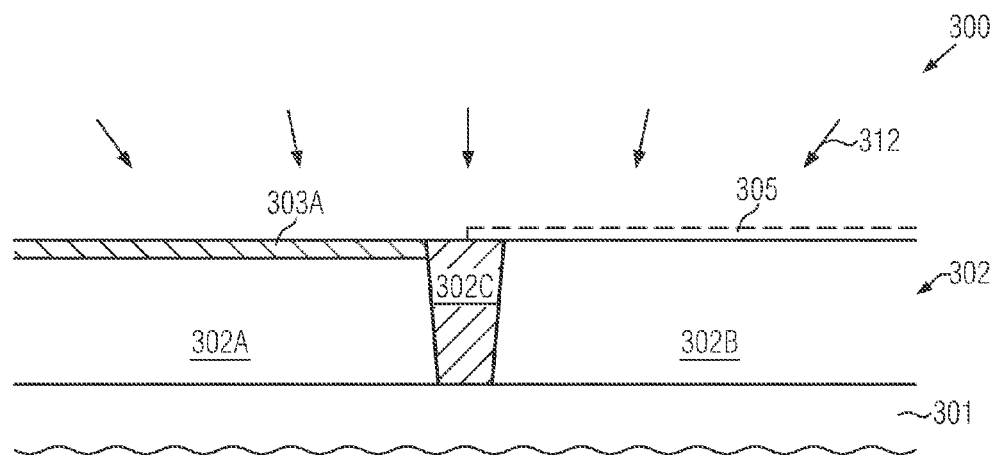

FIG. 3c schematically illustrates the device 300 in a further advanced indexing stage, in which at least one wet chemical process may be applied, for instance, during a process or process sequence 312 for removing the deposition mask 305. To this end, at least one wet chemical etch process may be applied during the sequence 312 so as to expose the active region 302B, without unduly affecting the threshold voltage adjusting semiconductor material 303A. Consequently, during the at least one wet chemical process in the sequence or process 312, the well-predictable and reduced removal rate may be in contact in the active region 302B due to the absence of carbon species. In some illustrative embodiments, a mask may be used, such as a resist mask, if any effect of the process 312 on the material 303A is considered inappropriate. In this case, any such optional resist mask may be removed after the removal of the deposition mask 305, or at least a significant portion thereof, on the basis of any appropriate process technique, which may also involve the application of a wet chemical process, however, without unduly removing material of the active region 302B.

Figure 3D:
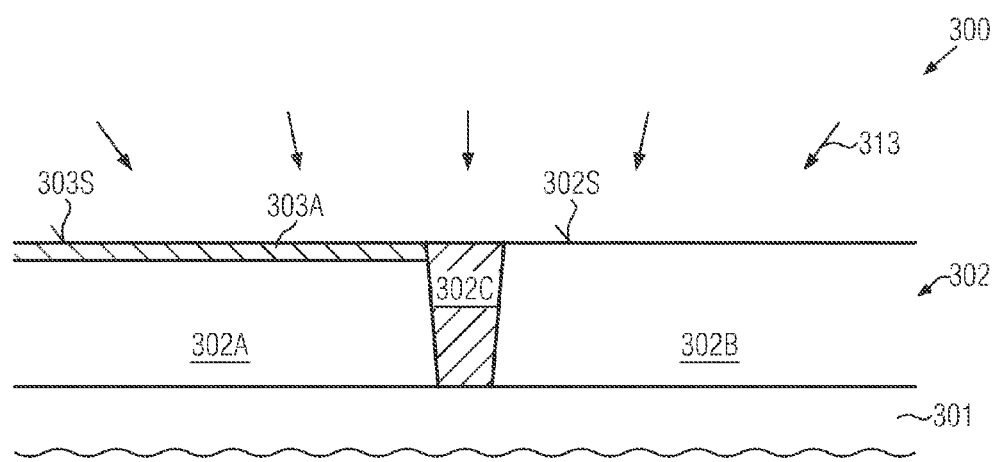

FIG. 3d schematically illustrates the semiconductor device 300 according to illustrative embodiments in which one further wet chemical process 313 may be applied so as to condition or prepare exposed surface areas 303S and 302S for the deposition of a dielectric material. To this end, the process 313 may be applied on the basis of any appropriate wet chemical cleaning recipe, for instance using HF, SPM (sulfuric acid/hydrogen peroxide mixture) and the like, in order to remove contaminants, native oxides and the like. In some illustrative embodiments, the wet chemical process 313 thus represents the last wet chemical process applied to the device 300 prior to forming a dielectric material layer, thereby covering the active regions 302A, 302B, for instance with a material that may be used as a part of a gate dielectric material during the further processing of the device 300.

Figure 3E:
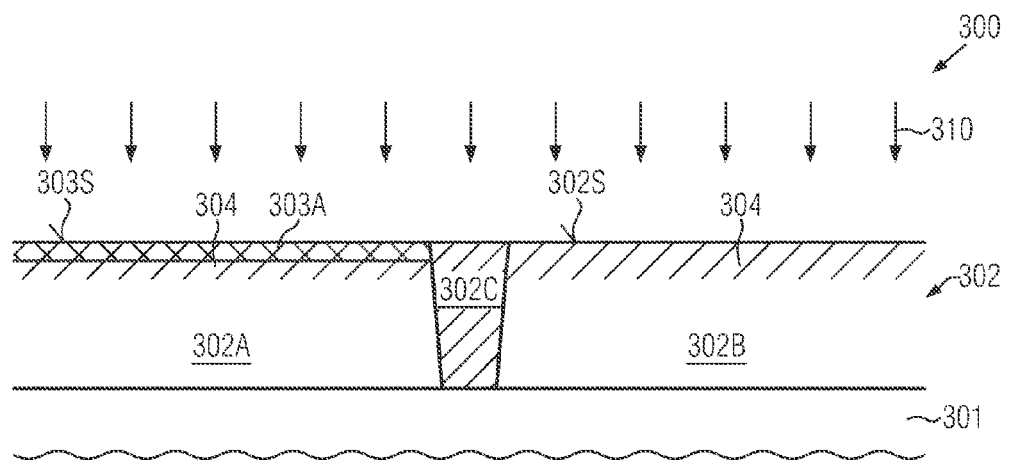

FIG. 3e schematically illustrates a cross-sectional view of the device 300 in an advanced manufacturing stage which, in some illustrative embodiments, may immediately follow the wet chemical process 313 of FIG. 3D. In other cases, the manufacturing stage as shown in FIG. 3e may represent any other point in the process flow after the removal of the deposition mask 305 (FIGS. 3b, 3c). As shown, an implantation process 310 may be performed so as to incorporate a carbon species 304 into the active regions 302A, 302B, as is also described above. That is, appropriate process parameters, such as implantation energy and dose, may be selected so as to position the dopant species 304 at or in the vicinity of the surface 302S and 303S.

Figure 3F:
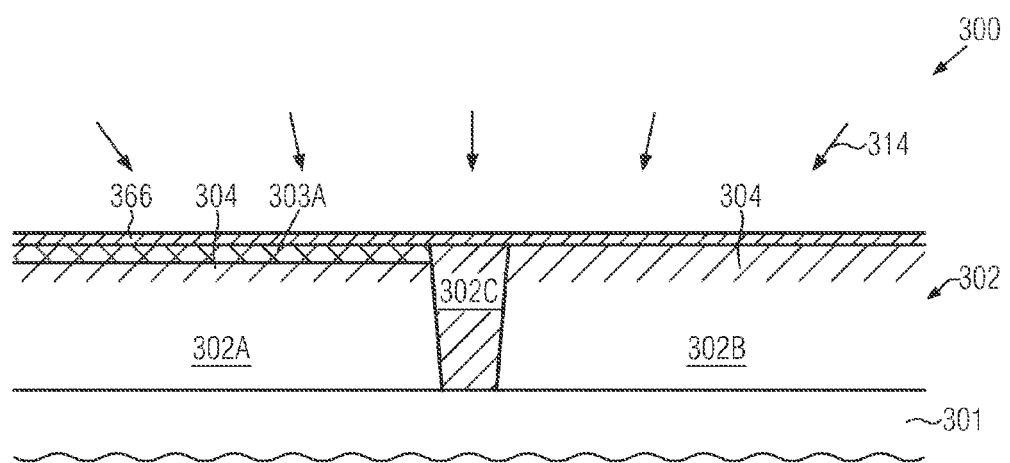

FIG. 3f schematically illustrates the device 300 in a further advanced infection stage, in which, according to some illustrative embodiments, without any intermediate wet chemical process, a process 314, such as a high temperature oxide deposition process, a high temperature oxidation process and the like, may be applied so as to form a dielectric layer 366 on the exposed active regions 302A, 302B. To this end, any well-established recipes may be applied so as to obtain the material 366, for instance in the form of a silicon dioxide material, a silicon oxynitride material and the like, with appropriate material composition and thickness as required, in some illustrative embodiments, for the further processing when forming sophisticated gate electrode structures.

Figure 3G:
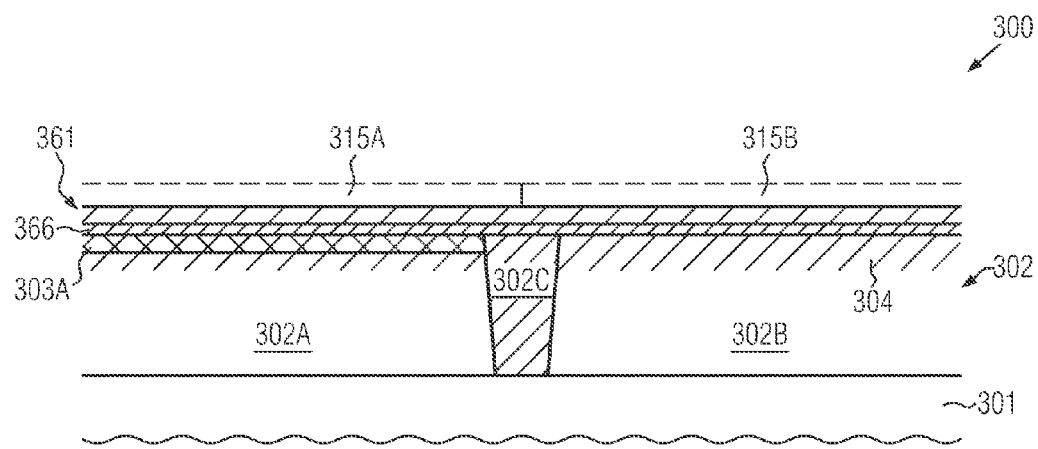

FIG. 3g schematically illustrates the device 300 in a further advanced manufacturing stage, in which a gate dielectric material 361, possibly in combination with the previously formed dielectric layer 366, may be provided, as required for the further processing of the device. For example, the material 361 may be provided in the form of a high-k dielectric material, such as hafnium oxide, zirconium oxide and the like, with an appropriate thickness, wherein the dielectric material 366 may provide superior interface characteristics, if considered appropriate. Moreover, function metal leaders 315A, 315B may be provided above the active regions 302A, 302B, respectively so as to enable an appropriate adjustment of the work function for gate electrode structures and thus transistors still to be formed in and above the active regions 302A, 302B.

The device 300 may be formed on the basis of any appropriate process sequence, i.e., the material 361 may be deposited, followed by the deposition and patterning of the materials 315A, 315B. Thereafter, a heat treatment may be performed so as to initiate a diffusion of any work function metal species into the lower lying material layer 361. Thereafter, the material layers 315A, 315B may be removed and may be replaced by a different appropriate metal-containing electrode material, such as titanium nitride and the like. In other cases, the materials 315A, 315B may be provided as permanent material layers, possibly in combination with an appropriate conductive barrier material, such as titanium nitride and the like. It should be appreciated that, due to the late incorporation of the carbon species 304, any of these process steps may be performed on the basis of a superior surface topography.

Figure 3H:
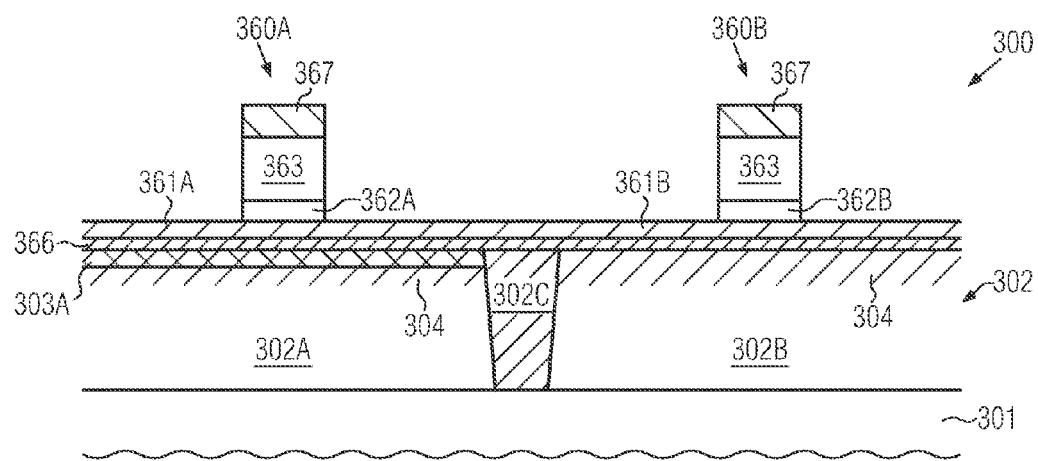

FIG. 3h schematically illustrates the device 300 in a further advanced manufacturing stage. As illustrated, a first gate electrode structure 360A is formed above the active region 302A and may comprise a metal-containing electrode material 362A in combination with a semiconductor material 363 and a dielectric cap layer 367, while the layers 361A, 366, if provided, may still be in a non-patterned stage. Similarly, a second gate electrode structure 360B comprising a metal-containing electrode material 362B in combination with the materials 363 and 367 may be provided above the active region 302B, while a gate dielectric material 361B possibly in combination with the dielectric material 366 may also be provided in a non-patterned state.

The gate electrode structures 360A, 360B may be formed on the basis of sophisticated patterning strategies as, for instance, also described above, wherein the superior surface topography, in particular above the active region 302B, due to the late incorporation of the species 304 may result in superior patterning uniformity. Thereafter, the process may be continued by patterning the layers 361A, 361B and 366, by applying well-established process techniques, while also in this case a significantly less pronounced patterning related non-uniformity may be accomplished.

Figure 3I:
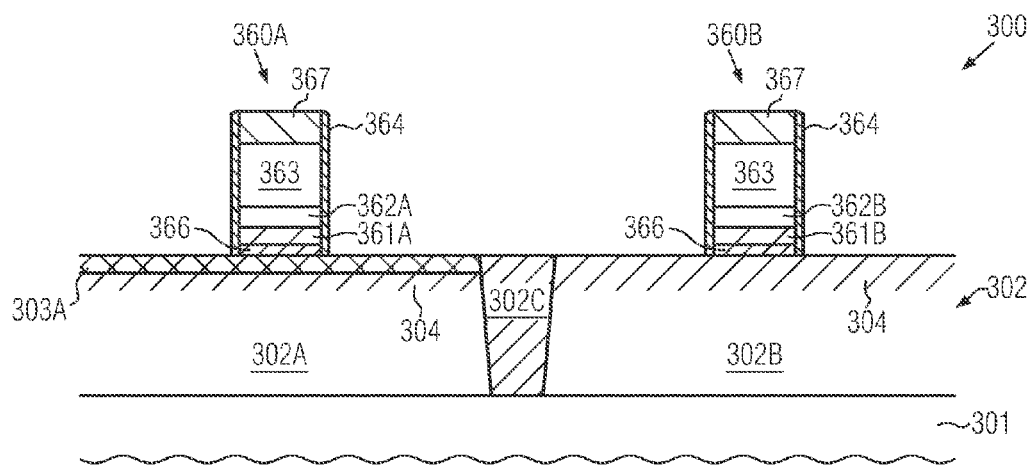

FIG. 3i schematically illustrates the device 300 in a further advanced manufacturing stage, in which the gate electrode structures 360A, 360B comprise the patterned layers 361A, 366, 361B, which in turn may be reliably confined laterally by a liner material 364. The liner 364 may be formed on the basis of well-established sophisticated deposition techniques, such as multilayer deposition, low pressure chemical vapor deposition (CVD) and the like, so as to provide the liner 364 with a desired thickness and material composition. For example, the liner 364 may be provided as a silicon nitride material with a thickness of 1-5 nm. Contrary to the conventional approaches, as, for instance, described with reference to FIG. 1h, the liner 364 may be provided on the basis of superior surface conditions, thereby significantly reducing the probability of resulting in any exposed surface areas of the sensitive materials 361A, 361B, 362A, 362B during the further processing of the device 300.

Figure 3J:
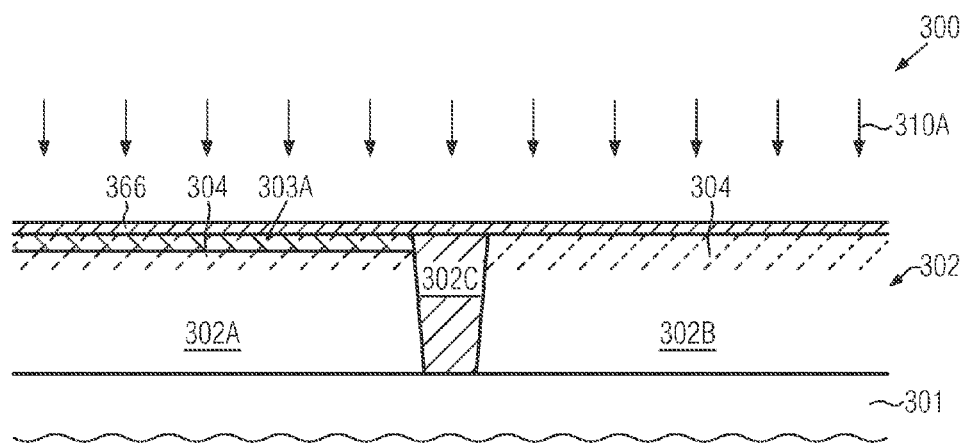

FIG. 3j schematically illustrates the semiconductor device 300 according to further illustrative embodiments in which the incorporation of the carbon species 304 may be performed in a later manufacturing stage. As shown, the device 300 may already comprise the dielectric layer 366, which may be formed on the basis of a process sequence as described above, however, omitting the incorporation of the species 304. In this case, the dielectric layer 366 may be formed immediately after a corresponding wet chemical conditioning process, thereby reducing the probability of any intermediate surface contamination. After forming the layer 366, an implantation process 310A may be performed with appropriately adapted process parameters so as to incorporate the carbon species 304 through the layer 366. It should be appreciated that implantation-induced damage in the layer 366 and in the active regions 302A, 302B may be efficiently reduced by performing an appropriate anneal process. For example, sophisticated rapid thermal anneal techniques may be applied, while, in other cases, a laser-based anneal process, flashlight-based anneal process and the like may be used. Thereafter, the processing may be continued, as is also discussed above with reference to FIG. 3h, in order to provide the gate materials and patterning the same.

In other illustrative embodiments (not shown), one or more further gate materials may be deposited prior to actually incorporating the species 304 on the basis of the implantation process 310A, if a corresponding screening effect of any such leaders may be considered appropriate for incorporating the species 304.

Figure 3K:
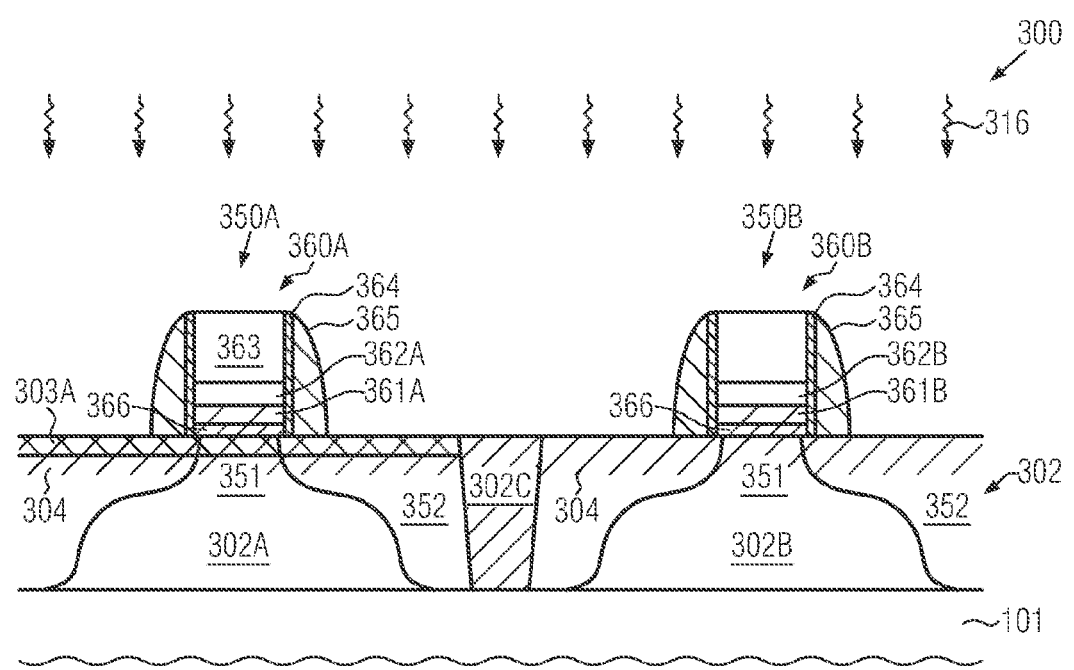

FIG. 3k schematically illustrates the semiconductor device 300 in a further advanced manufacturing stage. As shown, a transistor 350A, which in one illustrative embodiment is a P-channel transistor, may be formed in and above the active region 302A, while a second transistor 350B, in one illustrative embodiment an N-channel transistor, may be formed in and above the active region 302B. The transistors 350A, 350B may comprise drain and source regions 352, which may have any appropriate dopant profile so as to obtain the desired transistor characteristics in combination with the sophisticated gate electrode structures 360A, 360B, as is also discussed above. To this end, the gate electrode structures 360A, 360B may comprise a spacer structure 365, which may be used as an implantation mask for incorporating drain and source dopant species into the respective active regions 302A, 302B on the basis of an appropriate masking regime.

Generally, the transistors 350A, 350B may be formed on the basis of any appropriate process technique, as, for instance, described above with reference to the semiconductor device 100. Thereafter, one or anneal processes 316 may be applied, for instance in the form of a laser-based anneal process, wherein the presence of the carbon species 304 may provide for a reduced interaction of the sensitive materials 361B, 362B with other species, such as oxygen, thereby providing superior threshold voltage stability, as is also explained above with reference to the semiconductor device 100.

As a result, the present disclosure relates to manufacturing techniques in which carbon may be implemented into the active regions of sophisticated transistors, in particular of N-channel transistors, wherein a late incorporation of the carbon species reduces or voids the interaction of the carbon-doped semiconductor base material with wet chemical processes so that superior surface conditions may be provided upon patterning the sophisticated high-k metal gate electrode structures. In this manner, the carbon species may result in superior transistor performance and reduced width dependency of the threshold voltage, while at the same time significant yield losses may be reduced, which are observed in conventional strategies. In this respect, the increased etch rate of the carbon-doped semiconductor material in the active region has been identified as one dominant mechanism that may cause an increased surface topography prior to performing the complex gate patterning process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a threshold voltage adjusting semiconductor material on a semiconductor material of a first active region of a first transistor, while masking a second active region of a second transistor;
   performing at least one wet chemical process;
   after performing said at least one wet chemical process, providing a carbon species near a surface of said first and second active regions;
   forming a dielectric material layer above said first and second active regions after providing said carbon species; and
   forming a first gate electrode structure on said threshold voltage adjusting semiconductor material of said first active region and a second gate electrode structure on said second active region by using said dielectric material so as to provide a gate dielectric material.

2. The method of claim 1, further comprising forming first and second drain and source regions in said first and second active regions, respectively, by performing at least one laser-based spike anneal process.

3. The method of claim 1, wherein said at least one wet chemical process is performed after forming said threshold adjusting semiconductor material in said first active region.

4. The method of claim 3, wherein performing said at least one wet chemical process comprises removing a mask formed above said second active region by applying at least a wet chemical etch process.

5. The method of claim 1, wherein performing said at least one wet chemical process comprises performing a cleaning process so as to prepare said first and second active regions for the deposition of said dielectric material layer.

6. The method of claim 5, wherein forming said dielectric material layer comprises performing a deposition process after providing said carbon species without applying any further wet chemical process.

7. The method of claim 1, further comprising performing at least one anneal process prior to performing said at least one chemical process, wherein a temperature is selected to be approximately 1000° C. or higher for approximately 30 minutes or more.

8. The method of claim 7, further comprising performing a second anneal process at a temperature of approximately 1000° C. or higher prior to performing said at least one wet chemical process.

9. The method of claim 8, wherein said second anneal process is applied for a time interval of approximately 30 minutes or more.

10. The method of claim 1, further comprising forming a protective liner on said sidewalls of said first and second gate electrode structures so as to confine sidewalls of a high-k dielectric material and a metal-containing electrode material.

11. The method of claim 1, wherein said first transistor is a P-channel transistor and said second transistor is an N-channel transistor.

12. The method of claim 11, wherein said threshold voltage adjusting semiconductor material comprises silicon and germanium.

13. A method of forming a semiconductor device, the method comprising:
performing one or more wet chemical processes on a surface of a first active region;
after performing said one or more wet chemical processes, incorporating carbon into said first active region;
incorporating carbon into a second active region that has an inverse conductivity type compared to said first active region;
forming a threshold adjusting semiconductor material selectively in said second active region, while masking said first active region;
forming a dielectric layer on at least said first active region having incorporated therein said carbon without applying a further wet chemical process; and
forming a gate electrode structure above at least said first active region by using said dielectric layer.

14. The method of claim 13, further comprising forming a protective liner on sidewalls of said gate electrode structure so as to confine a high-k dielectric material and a metal-containing electrode material.

15. The method of claim 13, wherein carbon is incorporated into said first active region and said second active region by performing a single implantation process.

16. The method of claim 13, wherein said threshold adjusting semiconductor material is formed prior to incorporating carbon into said second active region.

17. The method of claim 13, further comprising annealing said semiconductor device at least once at a temperature of approximately 1000° C. or higher prior to performing said one or more wet chemical processes.

18. A method, comprising:
forming a threshold voltage adjusting semiconductor material on a first active region, while masking a second active region with a dielectric deposition mask;
conditioning a surface of said first and second active regions by performing at least one wet chemical process;
incorporating carbon into said first and second active regions after performing said at least one wet chemical process; and
forming a first gate electrode structure on a conditioned surface of said first active region and a second gate electrode structure on a conditioned surface of said second active region, said first and second gate electrode structures comprising a high-k dielectric material.

19. The method of claim 18, further comprising performing at least two anneal processes at a temperature of approximately 1000° C. and higher prior to conditioning said surface of said first and second active regions.

* * * * *